Figure 1:
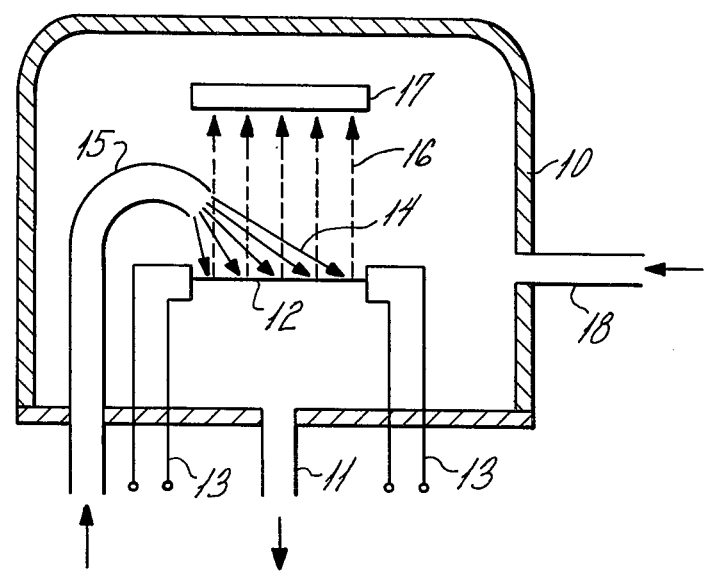

United States Patent [19]

Wiesmann

[11] 4,237,150
[45] Dec. 2, 1980

[54] METHOD OF PRODUCING HYDROGENATED AMORPHOUS SILICON FILM

[75] Inventor: Harold J. Wiesmann, Wantagh, N.Y.

[73] Assignee: The United States of America as represented by the United States Department of Energy, Washington, D.C.

[21] Appl. No.: 30,974

[22] Filed: Apr. 18, 1979

[51] Int. Cl.$^3$ .............................................. C01B 33/02
[52] U.S. Cl. .................................. 427/74; 252/62.3 E; 423/349; 427/84; 427/95; 428/428; 428/446
[58] Field of Search .................... 423/349; 427/74, 84, 427/95; 428/446, 428; 252/62.3 E

[56] References Cited

U.S. PATENT DOCUMENTS

| | | | |
|---|---|---|---|
| 2,993,763 | 7/1961 | Lewis | 423/349 |
| 4,064,521 | 12/1977 | Carlson . | |
| 4,113,514 | 9/1978 | Pankore et al. | |
| 4,142,004 | 2/1979 | Hauser et al. | 427/95 |
| 4,151,058 | 4/1979 | Kaplan et al. | |

OTHER PUBLICATIONS

Deneuville et al. "Thin Solid Films", vol. 55, No. 1, Nov. 1978 pp. 137–141, Elsevier Sequola S. A. Lausanne.

*Primary Examiner*—Jack Cooper
*Attorney, Agent, or Firm*—James E. Denny; Leonard Belkin; Cornell D. Cornish

[57] ABSTRACT

This invention relates to hydrogenated amorphous silicon produced by thermally decomposing silane (SiH$_4$) or other gases comprising H and Si, from a tungsten or carbon foil heated to a temperature of about 1400°–1600° C., in a vacuum of about $10^{-6}$ to $10^{-4}$ torr, to form a gaseous mixture of atomic hydrogen and atomic silicon, and depositing said gaseos mixture onto a substrate independent of and outside said source of thermal decomposition, to form hydrogenated amorphous silicon. The presence of an ammonia atmosphere in the vacuum chamber enhances the photoconductivity of the hydrogenated amorphous silicon film.

7 Claims, 1 Drawing Figure

U.S. Patent     Dec. 2, 1980     4,237,150

METHOD OF PRODUCING HYDROGENATED AMORPHOUS SILICON FILM

This invention was made under, or during, the course of, a contract with the U.S. Department of Energy.

BACKGROUND OF THE INVENTION

This invention relates to a method of producing hydrogenated amorphous silicon which comprises thermally decomposing a silane gas by directing a stream of said silane gas to impinge on a surface such as a tungsten or carbon foil heated to about 1400°–1600° C. in a vacuum to form a mixture of atomic hydrogen and atomic silicon, depositing said mixture onto a substrate, which can be heated to a temperature of less than 500° C., situated above said foil, and recovering hydrogenated amorphous silicon. Initial measurements indicate that the resulting films have a fairly high photoresponse. The introduction of ammonia along with the silane enhances the photoconductivity of the resultant hydrogenated amorphous silicon films.

Amorphous silicon is a material which has commercial application as a low cost photovoltaic material. However, the methods heretofore utilized in its preparation have limited its utility because of the presence of impurities and the failure of the removal of such impurities from the deposited amorphous silicon; as well as the non-uniformity in the electrical properties of the resultant deposited amorphous silicon film. This may have detrimental effects on electrical performance.

In addition, presently available processes of producing amorphous silicon, such as electron beam deposition, cause clusters of silicon to form, which are believed to degrade the properties of amorphous silicon.

It has now been found that in the present process, operation at high vacuum prevents interactions in the gas phase avoiding silicon cluster formation due to the long mean free paths. In addition, control of the temperature of the tungsten or graphoil surface will control the decomposition compounds coming from the silane gas or other silicohydride gas. Another advantage of present process, which utilizes a high vacuum environment, is that it can be used in combination with electron beam deposition.

The hydrogenated amorphous silicon produced by present process will possess superior properties since the silicon will be purely atomic prior to deposition. It is further believed that the excellent properties of this material comes from the significant passivation of dangling (free) bonds present in pure amorphous silicon, with the atomic hydrogen that results from the silane decomposition.

Accordingly, it is a primary object of instant invention to provide hydrogenated amorphous silicon having particular utility as a photovoltaic material, and for other uses involving semiconductors.

Another object of instant invention is to provide a process for the thermal decomposition of a silane from a hot tungsten or graphoil surface, into a gaseous mixture of atomic hydrogen and atomic silicon which is deposited on a substrate separate from and outside the source of thermal decomposition to form hydrogenated amorphous silicon.

Still another object of instant invention is to provide a hydrogenated amorphous silicon of improved photoconductivity and uniform electrical properties.

Still another object of instant invention is to provide an efficient process for producing a hydrogenated amorphous silicon film of controlled electrical properties.

Accordingly, present invention relates to a process of producing hydrogenated amorphous silicon which comprises thermally decomposing a gas containing silicon and hydrogen such as silane, disilane, trisilane, tetrasilane and the like into a mixture of atomic hydrogen and atomic silicon, and depositing said gaseous mixture onto a substrate separate from the source of thermal decomposition, which may or may not be heated.

More specifically, the present process of producing hydrogenated amorphous silicon comprises decomposing a silane gas by directing a beam of silane gas, preferably in an ammonia atmosphere, at a tungsten or graphoil sheet heated to a temperature of about 1400°–1600° C., in a vacuum of about $10^{-6}$ to $10^{-4}$ torr, into a gaseous mixture of silicon and atomic hydrogen, and collecting the reaction products on a substrate mounted above the heated sheet. This process involves a single, possibly catalyzed interaction between a silane molecule and a hot tungsten or graphoil surface to produce atomic silicon and atomic hydrogen. Upon hitting the hot foil, a portion of the silane gas ($SiH_4$) dissociates into a mixture of Si, H, SiH, $SiH_2$ and $SiH_3$. The relative proportion of the products is a function of the foil temperature. By directing a stream of silane (from a copper tube) at the hot foil, a locally high silane pressure is created at the surface of the hot foil (on the order of about $4 \times 10^{-4}$ torr). The decomposition takes place at the surface, such that a high pressure at the hot surface is necessary for the efficient operation of this method. This process allows for a more sensitive control of the local pressure at the hot foil, making for an efficient deposition process. Use of high vacuum makes this process compatible with other high vacuum techniques, such as electron beam deposition. Present process provides for a simple thermal decomposition process compared to glow discharge decomposition of silane in the production of amorphous silicon.

PRIOR ART

The thermal decomposition of silane at elevated temperatures in the production of amorphous, polycrystalline or monocrystalline silicon is generally known in the prior art. For example, U.S. Pat. No. 2,993,763 to Lewis discloses the process of preparing flakes of sintered silicon by decomposing silane in a vacuum chamber to form a first layer of a brown amorphous silicon deposited on the walls of said chamber and subsequent layers of sintered silicon, heating the deposited silicon to a temperature above 450° C. by means of a heated silicon element such as a silicon rod located within said chamber to further sinter the silicon and form large silvery-grey flakes of sintered silicon. The Benzing et al U.S. Pat. Nos. 3,014,791 and 3,112,997 disclose an apparatus and method for the pyroylsis of silanes to form a high yield of crystalline silicon and a low yield of amorphous silicon which consists in introducing a mixture of silane and hydrogen or helium gas via a glass tube into a vacuum chamber provided with a fused quartz heating tube which is heated to about 600°–800° C., said heating tube being provided with protrusions whereon hyperpure polycrystals of dense silicon is deposited, whereas amorphous silicon deposits on the walls of the chamber, and the liberated hydrogen is removed from the chamber.

U.S. Pat. No. 3,765,960 to Boss et al. discloses a method of minimizing autodoping during the deposition of epitaxial polycrystalline or amorphous layers of silicon on a heated silicon wafer which comprises contacting said wafer with a gaseous reaction mixture of hydrogen and silane at a temperature of 800°–1300° C., and at a pressure of 0.01 to 150 torr. U.S. Pat. No. 4,068,020 to Reuschel discloses the method of producing an amorphous silicon layer by pyrolytically depositing elemental silicon and a minor amount of at least one other element selected from Groups IV through VIII which are non-semiconductive, from a gaseous reaction mixture containing thermally decomposable compounds of silicon and said second element, onto a substrate (mandrel) heated to 800°–1150° C., said substrate being the heating element as well. In all of aforesaid processes, a heating element heated to 450°–1100° C., which may be silicon or fused quartz, is placed in a chamber containing a silane atmosphere, and amorphous silicon is deposited on the walls of the chamber and/or the heating element within said chamber.

In the production of crystalline silicon, the heating element for decomposing the silane is also the substrate for collecting the crystalline silicon as disclosed in U.S. Pat. No. 3,078,150 to Raymond, No. 3,130,013 to Wilson et al., and No. 3,140,922 to Sterling wherein the seed crystal is both the substrate and the heating element. U.S. Pat. No. 3,147,141 to Ishizuka replaces the seed crystal of the above processes with a tantalum wire as both the heating element and the substrate. The use of the heating element as the substrate (carrier) for the crystalline silicon in the thermal decomposition of silane is also disclosed by U.S. Pat. No. 3,160,522 to Heywang, who uses temperatures slightly in excess of 1420° C. (the melting point of silicon) and a quartz, ceramic or metal carrier; U.S. Pat. No. 3,286,685 to Sandmann et al., who use temperatures of 1100°–1400° C. and a silicon carrier; U.S. Pat. No. 3,496,037 to Jackson et al., who use a sapphire substrate and a temperature of 850°–1000° C.; U.S. Pat. No. 3,607,054 to Conrod who grows a continuous filament crystal on a seed crystal of silicon; U.S. Pat. No. 3,796,597 to Porter who heat treats the spinel ($MgO.Al_2O_3$) substrate to a temperature of 1045°–1145° C. to modify its surface and then deposits crystalline silicon thereon; and U.S. Pat. No. 4,027,053 to Lesk who produces a ribbon of polycrystalline silicon on a heated quartz or tungsten substrate at a temperature of 1000°–1200° C.

U.S. Pat. No. 3,900,597 to Chruma et al. places the substrate or carrier which are wafers of silicon, germanium, sapphire, spinel, ceramic, silicon dioxide, tungsten or molybdenum, into a quartz tube which is heated to 600°–700° C. under a vacuum of 600–1600 millitorrs; thereby disclosing a heating element which is separate from the substrate or carriers for the crystalline silicon. However, the wafer carriers or substrate are inside the heated quartz tube.

Although the prior art discloses the thermal decomposition of a gas containing hydrogen and silicon, such as silane, into amorphous and/or crystalline silicon which is deposited on the walls of the decomposition chamber, or on a substrate which also serves as the heating element or on a substrate situated within the thermal decomposition source (inside the heated tube); there is no disclosure of the production of hydrogenated amorphous silicon by directing a stream of silane gas against a heated tungsten or graphoil surface heated to 1400°–1600° C. and in a vacuum of $10^{-6}$ to $10^{-4}$ torr, whereby the silane decomposes at the heated surface into atomic hydrogen and silicon, which is collected on an independent substrate situated outside the thermal decomposition source. The presence of the hydrogen in the amorphous silicon film is responsible for improved electrical and optical properties, the hydrogen compensating dangling bonds present in pure amorphous silicon; whereas amorphous silicon produced by evaporation or sputtering in a pure argon atmosphere has low resistivity (about $10^3$ ohms cm), poor photoconductivity and a high optical absorption below 1.5 eV.

DESCRIPTION OF THE INVENTION

The hydrogenated amorphous silicon according to present invention is produced by the thermal decomposition of a gas containing silicon and hydrogen such as the silicohydrides which include monosilane, disilane, trisilane and tetrasilane, at a temperature above the decomposition temperature of said gas, preferably about 1400°–1600° C. and under a vacuum of preferably about $10^{-6}$ to $10^{-4}$ torr into a flux (mixture) of silicon and hydrogen, and depositing said flux as a film on a substrate independent of and positioned outside said source of thermal decomposition.

These and other novel features of the invention will be better understood with reference to the following description of one embodiment thereof, given by way of example in conjunction with the accompanying drawing which is a diagrammatic view of a suitable form of apparatus for carrying out the invention.

The apparatus comprises a vacuum chamber 10 pumped down to a reasonable vacuum, about $10^{-6}$ torr, via outlet pipe 11; a tungsten or graphoil sheet 12 positioned within said vacuum chamber 10 and heated by means of current leads 13 to a temperature preferably of about 1600° C., which is well above the decomposition temperature of silane (about 1000° C.), and maintained at about 1600° C. by resistive heating. A stream of silane gas 14 is directed at the target sheet 12 via a copper tube 15. Silane decomposes at target sheet 12 into atomic silicon and atomic hydrogen; the flux of silicon and hydrogen 16 is then deposited on a substrate 17 mounted above hot sheet 12. Substrate 17 upon which the hydrogenated amorphous silicon condenses, which is placed above sheet 12 can be heated if desired to a temperature below 500° C., and preferably 225°–325° C., with the film quality at 325° C. being optimum. A temperature above 500° C. produces crystalline silicon. At 1600° C., appreciable hydrogen is generated which reacts with the silicon condensing on the substrate to yield amorphous-silicon-hydrogen alloy. With this simple arrangement, it took 30 minutes to obtain a 2500 Å amorphous silicon film. With better shaping of the gas stream, and the tungsten or graphoil target, higher rates of deposition would be possible. At a temperature of 1400°–1600° C., the temperature of the tungsten filament or sheet is low enough so that the film is free of tungsten impurities. Ammonia may be introduced via inlet 18 to create an ammonia atmosphere in the vacuum chamber 10.

The ambient pressure before evaporation is in the low $10^{-6}$ torr range and rises into the low $10^{-4}$ torr range, indicative of the partial pressure of the silane and its decomposition products during deposition. Higher pressures may be used, limited only by the fact that at higher pressures there is appreciable interaction between molecules in the gas phase which may or may not be desirable. It is preferable to maintain an ambient pressure of about $10^{-6}$ to $10^{-4}$ torr in the vacuum chamber.

The substrate, which may be sapphire, fused quartz, silicon, or any other suitable material is placed about 6 inches away from the heated target surface 12 in order to promote uniform coatings, and amorphous silicon film growth rates of about 1 Å/sec. However, the distance of the substrate from heated surface 12 may be varied between 1 and 12 inches to produce film growths of ~ 3 Å/sec.

In addition, conventional dopant gases can be added to the silane, if desired, via copper tube 15 prior to decomposition of the silane from heated tungsten or graphoil sheet 12.

First films made by decomposition from a graphoil sheet are found to be initially better than films made by decomposition from a tungsten sheet. However, it was found that as a graphoil sheet was used for more films, the photoresponse of the subsequent films deteriorates and the cooler parts of the graphoil can be seen to have large amounts of Si. The temperature of the tungsten filament is low enough so that tungsten impurities in the film seem improbable and it is possible that some catalytic process occurs on the surface which makes the graphoil better. It is believed that the graphoil is initially more effective because much of the silicon is being absorbed in the graphite giving a large hydrogen:silicon ratio. This ratio gradually decreases as the surface becomes saturated, with a concomitant decrease in photoconductivity with consecutive use of a carbon foil. This is clearly shown in Table I, wherein sample C has the highest photoconductivity and the lowest growth rate (0.6 Å/sec.) of three consecutive films grown on graphoil (samples C, D and E). The exact nature of the species coming off the graphoil surface are unknown and probably consist of free silicon and/or Si-H complexes. It is assumed that for the hydrogen coming off to be effective, it must be in the atomic form. Another possible reason for the decrease of film quality is perhaps due to Si-C compounds being formed which have a vapor pressure much higher than that of the graphite.

The addition of ammonia, as a background gas, improves the photoconductivity (photoresponse) of the films. This is shown in Table I where an "ammonia" film (Sample G) from a carbon foil is compared to films from a tungsten foil with (Sample B), and without ammonia (Sample A), and a film made from a graphoil without ammonia (Sample F). It should be noted that the ammonia is not particularly effective when directed at the foil. The film improvement is only evident when ammonia gas is admitted to the vacuum chamber as a constant background pressure. The use of molecular hydrogen or methane gas as a background gas or as a stream of gas directed at the hot foil were found to be ineffective in improving the photoresponse of the films.

The temperature dependent photoconductivity and dark conductivity for a film deposited in an ammonia atmosphere from a carbon foil taken after the film was heated in vacuum to 175° C. were studied. The dark conductivity is $4 \times 10^{-8}$ (ohms-cm)$^{-1}$ at room temperature and exhibited a dark current activation energy of about 0.7 eV. These results would seem to indicate that either the films are not doped with nitrogen as has been observed for sputtered films, or that nitrogen doping does not strongly affect the Fermi level of the hydrogenated amorphous silicon. It is also possible that the nitrogen which is present is multiply bonded, and like hydrogen may be compensating potential dangling bonds in the sample. At present, there is no estimate as to the amount of nitrogen in the samples. It is tentatively assumed that the large increase in the photoconductivity is due to additional hydrogen which is supplied at the surface of the growing film where the ammonia is catalyzed to its equilibrium state, i.e., $2NH_3 \rightarrow N_2 + 3H_2$. It is believed that hydrogen available from the ammonia decomposition can be available on the surface as atomic hydrogen, which can react with the silicon surface, with the excess forming $H_2$. The photoconductivity of the film G as a function of illumination intensity shows that the films still have a large concentration of recombination centers but may show bimolecular recombination at sunlight intensities.

Table I gives the deposition parameters for hydrogenated amorphous silicon films of about 0.13 cm in length and about 1.2 to 2.4 cm in width, where d is the thickness of the film, and P is the pressure in torr. All films were made at a silane partial pressure of approximately $4 \times 10^{-4}$ torr.

TABLE I

| Sample | Foil | Gas | σR.T. (ohms cm$^{-1}$) | Growth Rate (A/sec) | d (A × 10$^3$) | P$_o$ (NH$_3$) |
|---|---|---|---|---|---|---|
| A | W |  | $5.4 \times 10^{-9}$ | 8.7 | 11.5 | — |
| B | W | NH$_3$ | $1.2 \times 10^{-7}$ | 1.8 | 2.8 | $2 \times 10^{-4}$ |
| C | C |  | $2.48 \times 10^{-8}$ | 0.6 | 1.8 | — |
| D | C |  | $1.9 \times 10^{-9}$ | 1.92 | 3.5 | — |
| E | C |  | $4.7 \times 10^{-7}$ | 1.88 | 4.5 | — |
| F | C |  | $1.0 \times 10^{-7}$ | 0.85 | 1.5 | — |
| G | C | NH$_3$ | $4 \times 10^{-8}$ | 0.6 | 1.4 | $2 \times 10^{-4}$ |

W is tungsten
C is graphite
σR.T. is room temperature photoconductivity

Increasing the substrate temperature from 275°–325° C. decreases the overall hydrogen content in the films since higher substrate deposition temperatures reduce the multiply grouped hydrogen sites. The formation of SiH is less temperature dependent in this range than the formation of SiH$_2$ and SiH$_3$ groups. Similar behavior is observed for silane films.

Similarly, it has been found that for a fixed deposition temperature (275° C.) and a fixed partial pressure of silane, the lower deposition rate produces the larger photocurrent. This is consistent with a higher percentage of hydrogen incorporated at the lower deposition rate.

A limited study of annealing was also done for some films. Typically, for samples heated at 375° C. for 1 hour, the room temperature photoconductivity dropped by a factor of two. Anneals to about 450° C. decreased the room temperature photoconductivity by a factor of 25 from the "as-deposited" value. For this anneal temperature however, the value of the room temperature dark conductivity increased. The large change in photocurrent after an anneal of 450° C. can be associated with loss of hydrogen from the sample. Films are stable upon removal from vacuum following deposition, but if these same films are vacuum annealed to about 175° C. to 200° C. and then exposed to air at room temperature, both the values of photoconductivity and dark conductivity increase by a factor of 20 over the period of a day or two. Since photoconductivity and dark conductivity are seen to increase, it is postulated that this time dependent behavior is the result of a slowly forming, relatively highly conductive layer on or in the surface layers of the film. The surface or surface layers are absorbing or adsorbing material from the atmosphere ($H_2O$ or $O_2$) forming a low resistivity layer on these highly resistive films. The photoconductivity is enhanced more at shorter wavelengths since the photocarriers are generated closer to the front of the film. The carriers generated in the bulk diffuse to the surface where they can drift farther before recombining than they could have otherwise.

It is also noted that this surface effect can be reversed to the initial "as-grown" values of photoconductivity and dark conductivity after a subsequent low temperature (about 200° C.) vacuum anneal. Upon exposure to air the time dependent behavior repeats. This would indicate that this surface layer is being desorbed during anneal and reabsorbed during air exposure.

The hydrogenated amorphous silicon films made according to this invention are different from, and possess significantly different electrical properties than the amorphous and crystalline silicon films prepared in the prior art.

There are significant differences in the magnitude of photoconductivity; the flux dependence of photoconductivity, i.e., activation energy decreases with increasing photon fluxes ($10^{13}$ to $10^{16}$ photon/$cm^2$-sec was used) which is contrary to glow discharge silane a-Si:H films, where only one activation energy is observed for a wide range of photon fluxes; and the nature of the hydrogen bonding in the silicon network. These differences may be due to the absence of contamination. They may also be related to structural defects in the hydrogenated films which are inherent in the nature of the present thermal decomposition process.

It has also been found that room temperature spectral photoconductivity depends, though not critically, upon the initial growth parameters: substrate temperature during deposition and deposition rate.

Finally, after measurements of temperature dependence are made and films are removed from a vacuum of $10^{-4}$ torr, a time dependent behavior is observed. The values of dark conductivity, the spectral dependence and the magnitude of the photoconductivity suggest that the surface or surface layers are absorbing (or adsorbing) material from the atmosphere forming a low resistivity layer on these highly resistive films. After such contamination, values of the dark conductivity and the photoconductivity become time dependent and unlike the "as-grown" films. The spectral response and the photoconductivity increased more at shorter wavelengths. Once exposed and changed, a film could be returned to its original state by an anneal at 200° C. in vacuum.

It is understood that the foregoing detailed description is given merely by way of illustration and that variations may be made therein without departing from the spirit of the invention. The "Abstract" given above is merely for the convenience of technical searchers and is not to be given any weight with respect to the scope of the invention.

I claim:

1. A method of producing hydrogenated amorphous silicon which comprises thermally decomposing a silicohydride gas by directing a stream of said silicohydride gas against a tungsten or carbon foil heated to a temperature of about 1400°–1600° C. and in a vacuum of about $10^{-6}$ to $10^{-4}$ torr, to form a gaseous mixture of atomic hydrogen and atomic silicon, and depositing said gaseous mixture onto a substrate independent of and situated a distance from said heated tungsten or carbon foil, to form a film of hydrogenated amorphous silicon on said substrate.

2. A method in accordance with claim 1, wherein the silicohydride is silane.

3. A method in accordance with claim 1, wherein the substrate is heated to a temperature less than 500° C.

4. A method in accordance with claim 1, wherein ammonia is introduced in the vacuum chamber to create an ammonia atmosphere.

5. A method in accordance with claim 1, wherein the substrate is heated to a temperature of about 225°–325° C.

6. A method in accordance with claim 1, wherein the substrate is a material selected from the group consisting of sapphire, fused quartz and crystal silicon.

7. A method in accordance with claim 1, wherein the film of deposited hydrogenated amorphous silicon is vacuum annealed to about 175°–200° C. and then exposed to air at room temperature to increase the photoconductivity and dark conductivity over a period of time.

* * * * *